United States Patent
Iwasaki

(10) Patent No.: US 8,963,081 B2
(45) Date of Patent: Feb. 24, 2015

(54) MASS SELECTOR, AND ION GUN, ION IRRADIATION APPARATUS AND MASS MICROSCOPE

(71) Applicant: Canon Kabushiki Kaisha, Tokyo (JP)

(72) Inventor: Kota Iwasaki, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/190,289

(22) Filed: Feb. 26, 2014

(65) Prior Publication Data

US 2014/0252225 A1   Sep. 11, 2014

(30) Foreign Application Priority Data

Mar. 6, 2013   (JP) .................. 2013-043801

(51) Int. Cl.
*H01J 49/40* (2006.01)
*H01J 49/06* (2006.01)

(52) U.S. Cl.
CPC .............. *H01J 49/061* (2013.01); *H01J 49/40* (2013.01)
USPC ........... 250/288; 250/281; 250/282; 250/287; 250/292; 250/306; 250/307; 250/309; 250/396 R

(58) Field of Classification Search
CPC ..... H01J 49/0004; H01J 49/004; H01J 49/04; H01J 49/044; H01J 49/0481; H01J 49/066; H01J 49/107; H01J 49/142; H01J 49/164; H01J 49/40; H01J 49/401; H01J 49/406; H01J 49/4225; H01J 49/424; H01J 49/067; H01J 49/061; H01J 49/063; H01J 37/026; H01J 37/045; H01J 37/08; H01J 37/147

USPC ......... 250/281, 288, 292, 305, 306, 307, 309, 250/396 R
See application file for complete search history.

(56) References Cited

U.S. PATENT DOCUMENTS

| | | | | |
|---|---|---|---|---|
| 4,072,862 A | * | 2/1978 | Mamyrin et al. ............. | 250/286 |
| 5,371,366 A | * | 12/1994 | Marui ............................. | 850/12 |
| 5,614,711 A | * | 3/1997 | Li et al. .......................... | 250/287 |
| 6,013,913 A | * | 1/2000 | Hanson ........................ | 250/287 |
| 6,291,820 B1 | * | 9/2001 | Hamza et al. ................. | 250/282 |
| 6,541,769 B1 | * | 4/2003 | Takada et al. ................. | 250/290 |

(Continued)

FOREIGN PATENT DOCUMENTS

| | | |
|---|---|---|
| JP | 2011-29043 A | 2/2011 |
| WO | 2010/029929 A1 | 3/2010 |

(Continued)

*Primary Examiner* — David A Vanore
(74) *Attorney, Agent, or Firm* — Fitzpatrick, Cella, Harper & Scinto

(57) ABSTRACT

When a time-of-flight mass selector having a chopper using a deflector selects the masses of the ions, an ion beam is deflected. As a result, at least a part of the ion beams diagonally pass through an aperture electrode with respect to the axis. Accordingly, there has been a problem that a position on an object irradiated with a cluster ion beam, results in moving. This mass selector includes: a flight tube having an equipotential space that makes a charged substance fly therein; a deflector that is installed in a downstream side with respect to the flight tube in a direction in which the charged substance flies; a first aperture electrode that is installed in a downstream side with respect to the deflector in a direction in which the charged substance flies; and a second aperture electrode that is installed in between the deflector and the first aperture electrode.

24 Claims, 8 Drawing Sheets

(56) References Cited

U.S. PATENT DOCUMENTS

| | | | |
|---|---|---|---|
| 6,630,665 B2 * | 10/2003 | Tanner et al. | 250/306 |
| 6,664,545 B2 * | 12/2003 | Kimmel et al. | 250/396 R |
| 6,815,667 B2 * | 11/2004 | Tanner et al. | 250/281 |
| 7,495,212 B2 * | 2/2009 | Kim et al. | 250/292 |
| 7,683,318 B2 * | 3/2010 | Bunton et al. | 250/309 |
| 7,687,771 B2 * | 3/2010 | Jolliffe et al. | 250/285 |
| 7,858,926 B1 * | 12/2010 | Whitehouse et al. | 250/281 |
| 8,481,963 B2 * | 7/2013 | Loucks et al. | 250/397 |
| 8,610,056 B2 * | 12/2013 | Whitehouse et al. | 250/287 |
| 2005/0205800 A1 * | 9/2005 | Barnard et al. | 250/423 R |
| 2013/0180844 A1 * | 7/2013 | Barnard | 204/192.33 |

FOREIGN PATENT DOCUMENTS

| | | |
|---|---|---|
| WO | 2013/054937 A1 | 4/2013 |
| WO | 2013/073373 A1 | 5/2013 |

\* cited by examiner

MASS SELECTOR, AND ION GUN, ION IRRADIATION APPARATUS AND MASS MICROSCOPE

BACKGROUND OF THE INVENTION

1. Field of the Invention

The present invention relates to a mass selector which selects a mass-to-charge ratio of an ion based on a relationship between a time of flight and the kinetic energy of the ion; and an ion gun, an ion irradiation apparatus and a mass microscope which use the same.

2. Description of the Related Art

A cluster ion beam can be obtained by ionizing a particle which is formed of a cluster generated from a high-pressure gas that has been injected into a vacuum from a nozzle, or a particle which is formed of a cluster that has been generated by the cooling of a vapor of a solid, through an electron impact ionization or a photo-ionization process.

In addition, the cluster ion beam formed of the clustered particles can be generated by a direct ionization of the surface of a charged droplet, a solid or liquid by field evaporation, even though the particle does not pass through the ionizing process.

A technique of irradiating the surface of a solid with the cluster ions is used in a surface processing such as etching, sputtering and film-forming. In addition, when the surface is irradiated with a cluster ion having a large mass, the cluster ion has an effect of being capable of ionizing a high polymer while suppressing the fragmentation. Accordingly, the technique is effectively applied also to a surface analysis apparatus (Japanese Patent Application Laid-Open No. 2011-29043). When the technique is applied to the surface analysis apparatus, sputtering efficiency and ionization efficiency for an object to be irradiated vary according to the size of the cluster ion. Accordingly, it is desirable that a cluster ion having a predetermined size is selected and then the object is irradiated with the selected cluster ion.

A cluster ion irradiation apparatus has a cluster ion gun, a beam control section, and an irradiation section. The cluster ion gun includes a cluster ion generation section and a mass selector. Each part is evacuated by a vacuum pump, and constitutes the whole vacuum chamber.

The cluster ions which have been generated in the cluster ion generation section usually include clusters having various sizes. Accordingly, in many cases, cluster ions having a predetermined size are selected after the generated cluster ions have been incident on the mass selector, and then the object is irradiated with the selected cluster ions.

In mass selection methods, there exist a magnetic field type (WO 10/029929), a quadrupole type, a time-of-flight type and the like, but the time-of-flight type mass selection method is suitable for the cluster ion having the large mass. The time-of-flight type mass selection method is a method which is used when the flight distance and the energy of ions are known, and is a method of selecting the ions according to the mass based on a relationship between the times of flight and the energy of the ions which have been pulsed (though reference pulse in measurement for time of flight of ion is referred to as trigger pulse, in the present invention) prior to the mass selection.

In this case, the relationship between the time of flight and the energy of the ion is expressed by Expression 1. Accordingly, a difference between masses causes a difference also between the times of flight (though this relationship is referred to as mass dispersion, in the present invention). If this relationship is used, only the ions having a particular time of flight are taken out, and thereby ions having an identical mass can be obtained.

Expression 1

$$\frac{m}{z} = 2eV\left(\frac{t}{L}\right)^2 \quad \text{(Expression 1)}$$

Here, m represents the mass of an ion, z represents a valence of the ion, t represents a period of time in which the ion flies in an equipotential space, V represents a passage voltage of the ion, L represents a flight distance, and e represents an elementary electric charge.

On the other hand, in the time-of-flight type mass selection method, a relationship among the mass m and a mass difference Δm of an ion to be mass-selected and the time t of flight and the time difference Δt of the ion is expressed by Expression 2. The time difference Δt is dominated by a duration time of a trigger pulse, a measuring error in the measurement of the time of flight t, and the like.

Expression 2

$$\frac{\Delta m}{m} = 2\frac{\Delta t}{t} \quad \text{(Expression 2)}$$

Here, (Δm/m) represents a mass resolution, and in order to obtain a high mass resolution, it is effective to shorten the time difference Δt by shortening the duration time of the trigger pulse.

Units which are used for generating pulsed ions include: (1) a method of using an ion source which generates ions in a pulsing way; and (2) a method of combining an ion source which generates ions continuously in terms of time (in DC-like way) with a chopper which temporarily interrupts the ions. Incidentally, in the present invention, an operation of passing ions only in fixed periods of time in a traveling direction to pulse the ions is referred to as chopping, and a mechanism of conducting the operation is referred to as a chopper.

The type of chopper is roughly classified into two types which are a retarding method (retarding) and a blanker method (blanker).

The retarding method is a method of applying a coulomb force to the ion which has been emitted from the ion source, in a direction opposite to the traveling direction of the ion, and thereby making the ion reflected.

The blanker method is a method of using a parallel flat-plate electrostatic deflector which deflects the flight direction of the ion toward a direction perpendicular to the traveling direction of the ion or a deflector which deflects the ion by a magnetic field, in combination with an aperture electrode having an opening therein through which the ion passes.

In the blanker method, when an appropriate voltage is applied to the deflector, at least a part of the ions which have been incident on the aperture electrode passes through the opening of the aperture electrode. In addition, when an appropriate voltage different from the above voltage is applied to the deflector, the ion trajectory is deflected so as to collide against the aperture electrode, and accordingly the ions do not pass through the opening. According to such an operation, the blanker method can pass the ions through the opening only in a fixed period of time in the traveling direction, or can interrupt the ions from passing through the opening.

The electrostatic type of blanker method has a feature of being capable of pulsing ions at high speed, can pulse the ions with such a short duration time as an order of microseconds or shorter, and accordingly is often used for the time-of-flight type mass selection method.

The time-of-flight mass selector can obtain a beam of cluster ions having an identical mass (can select mass) by bringing mass dispersion out in the cluster ion beam in which the cluster ions having various masses exist together therein, and taking out the cluster ions having a particular time of flight.

In the cluster ion irradiation apparatus, the cluster ions which have been mass-selected are subjected to the control of acceleration, deceleration, focusing or dispersion in the beam control section, and then, an object to be processed or a sample, which is an object to be irradiated and is arranged in the irradiation section, is irradiated with the controlled cluster ions.

As has been described above, a cluster ion beam contains clusters having various sizes before being subjected to mass selection, and accordingly the time-of-flight type mass selection method is required to have a high mass resolution.

In order to attain the high mass resolution, a mass selector needs to select cluster ions having different times of flight in such a way that the time difference is short. Accordingly, it is effective to use a blanker type of chopper for the time-of-flight type mass selection method.

On the other hand, when an object to be processed or a sample is irradiated with the cluster ion which has been mass-selected, it becomes necessary that the position on the object to be processed or the sample, which is irradiated with the cluster ion beam, is controlled with high accuracy.

This is because the accuracy of the position on the object to be processed, which is irradiated with the cluster ion beam, exerts an effect on the processing accuracy of etching or the like and the measurement accuracy of a spatial distribution of secondary ions or neutral particles when the secondary ions or the neutral particles emitted from the sample are measured.

Particularly, when the cluster ion is used for irradiating an object as a primary ion of a so-called time-of-flight secondary ion mass spectrometer (TOF-SIMS) which measures the secondary ions that have been generated by irradiation with ions, with a time-of-flight mass analyzer, it is required that the object is irradiated with the cluster ions having a short pulse in terms of time and with high positional accuracy.

However, conventionally, there has been the case where the positional accuracy is not sufficiently controlled. For instance, when the blanker type of chopper has been used, the deflector deflects the cluster ion beam to a direction perpendicular to the traveling direction of the cluster ion beam. Accordingly, a trajectory of at least a part of the cluster ion beams are changed, and the changed cluster ion beam passes through the aperture electrode diagonally with respect to the direction in which the cluster ion beam has traveled before being mass-selected. The cluster ion beam which has diagonally passed through the aperture electrode irradiates the position on an object to be irradiated, which is different from a position that an undeflected cluster ion beam has irradiated. Similarly, also in the case when the retarding type of chopper is used, the trajectory of the cluster ion beam is deflected, and thereby the accuracy of the position is lowered which is irradiated with the beam.

Accordingly, the time-of-flight mass selector having the blanker type of chopper has had such a problem that the accuracy of the position on the object to be processed or the sample decreases, which is irradiated with the cluster ion, when the mass selector selects the masses of the ions.

The present invention is designed with respect to the above described problems, and is directed at providing a time-of-flight mass selector that can irradiate an object to be processed or a sample with ions of which the masses have been selected, with high positional accuracy.

SUMMARY OF THE INVENTION

A mass selector according to the present invention includes: a vacuum chamber having an equipotential space that makes a charged substance fly therein; a deflector that is installed in a downstream side with respect to the vacuum chamber in a direction in which the charged substance flies; a first aperture electrode that is installed in a downstream side with respect to the deflector in the direction in which the charged substance flies; and a second aperture electrode that is installed in between the deflector and the first aperture electrode.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

An ion mass selector in the present embodiment and a method for operating a cluster ion irradiation apparatus having the same will be described below with reference to FIG. 1, while the application to a secondary ion mass spectrometer is taken as an example.

(Operation Principle)

Figure 1A:
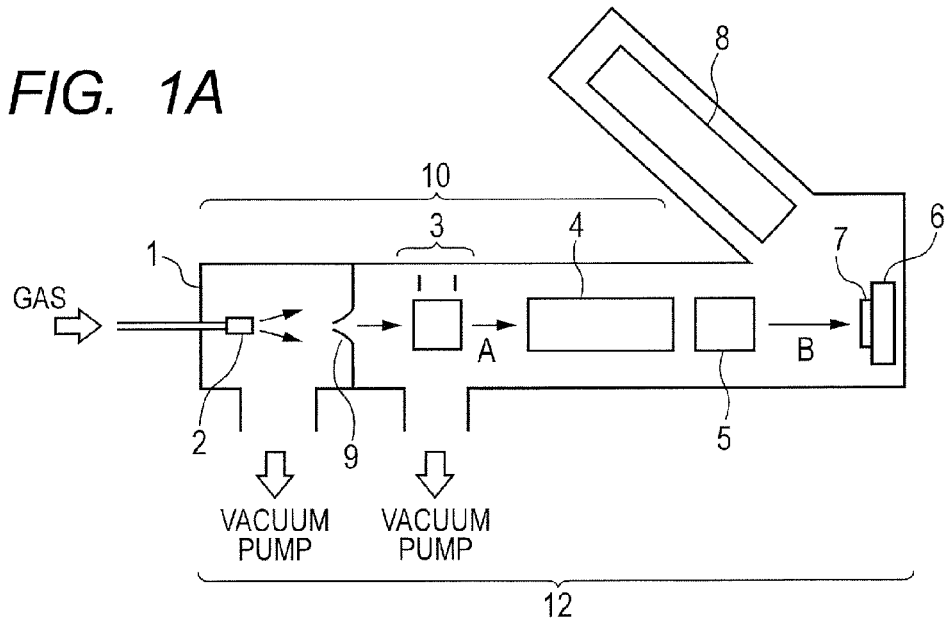
FIG. 1A illustrates a cluster ion irradiation apparatus according to the present invention.

As is illustrated in FIG. 1A, a cluster ion irradiation apparatus 12 in the present embodiment has a nozzle 2, an ionization section 3, a mass selector 4, a focusing section 5 and an irradiation stage 6, and each part constitutes the whole vacuum chamber 1. In addition, the nozzle 2, the ionization section 3 and the mass selector 4 constitute an ion gun 10. Furthermore, the cluster ion irradiation apparatus 12 in the present embodiment has a not-shown vacuum exhausting system and a signal processing system. An object 7 to be irradiated is installed on the irradiation stage 6.

Substances that become raw materials of the cluster are supplied to the nozzle 2 through a gas introduction pipe, which include: rare gas (Ar, Ne, He, Kr and the like); molecular gas ($CO_2$, CO, $N_2$, $O_2$, $NO_2$, $SF_6$, $Cl_2$, $NH_4$ and the like); alcohol (ethanol, methanol, isopropyl alcohol and the like); and water. An acid and/or a base may be added to these water and/or alcohol.

A gas introduction pressure is not limited in particular, but may be within a range of 0.001 to 100 atmosphere, and further may be 0.1 to 20 atmosphere.

When the gas is injected into the vacuum chamber 1 from the nozzle 2 at a supersonic speed under a reduced-pressure atmosphere, the supplied gas or liquid is cooled due to adiabatic expansion, and a gas containing the cluster is generated which consists of condensed atoms or molecules.

At least any one of the cluster and the gas is incident on the ionization section 3 through a skimmer 9. In the ionization section 3, an electron source such as a hot filament, for instance, is arranged. The ionization section 3 ionizes the atoms or molecules which constitute the cluster, with electrons generated in the electron source, and generates a cluster ion beam A.

The ionization section 3 generates cluster ions and monomer ions which have various sizes. The cluster ion beam A containing the ions is incident on the mass selector 4, and is subjected to mass selection in the mass selector 4.

Figure 1B:
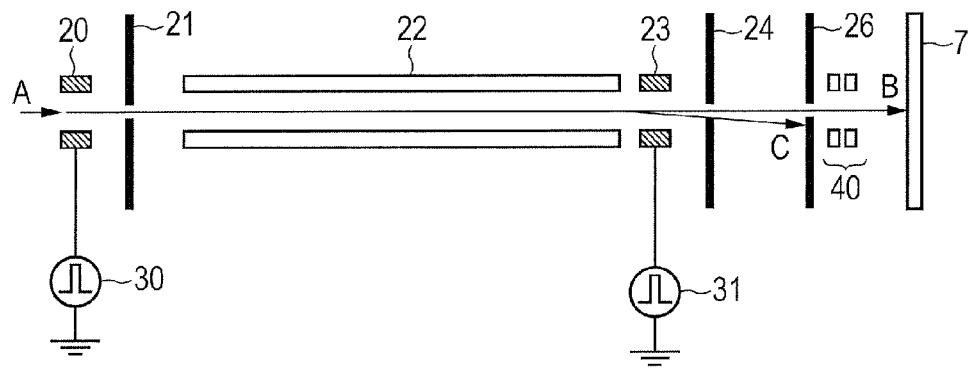
FIG. 1B illustrates an ion mass selector according to a first embodiment.

As is illustrated in FIG. 1B, the mass selector 4 has a deflector for a trigger 20, an aperture electrode for a trigger 21, a flight tube 22 which is arranged so as to surround an equipotential space formed in the vacuum chamber 1, a deflector for a gate 23, a first aperture electrode 26 as an aperture electrode for a gate, and a second aperture electrode 24 as an outgoing side aperture electrode. The deflector for the trigger 20 and the aperture electrode for the trigger 21, and the deflector for the gate 23 and the aperture electrode for the gate 26 constitute a chopper in a blanker method, respectively.

The cluster ion beam A is incident between a pair of parallel flat-plate electrodes which constitute the deflector for the trigger 20. Different voltages are applied to these parallel flat-plate electrodes, respectively, and thereby an electric field is formed therebetween. In addition, the aperture electrode for the trigger 21 is installed in the downstream side in the direction in which the cluster ion beam A flies.

When an appropriate voltage VTpass is applied between the parallel flat-plate electrodes which constitute the deflector for the trigger 20, by a pulsed power supply 30 for a trigger, the cluster ion beam A passes through the opening of the aperture electrode for the trigger 21. On the other hand, when a voltage VTstop which is different from the above described voltage is applied therebetween from the pulsed power supply 30 for the trigger, the cluster ion beam A is deflected by the deflector for the trigger 20 and collides against another place of the aperture electrode for the trigger 21 than the opening thereof. In other words, the cluster ion beam A is interrupted.

Figure 5A:
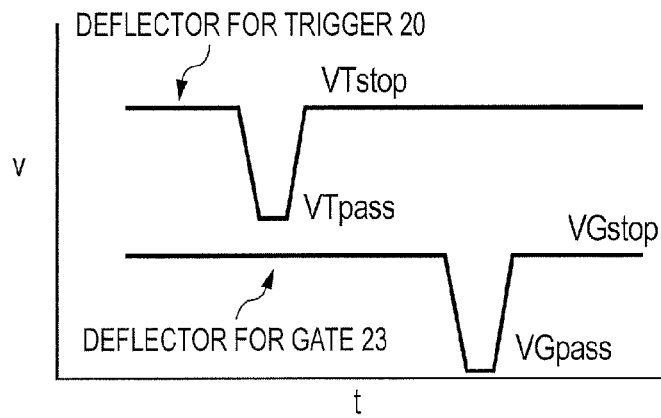
FIG. 5A illustrates a voltage applied to a pulse type deflector.
Figure 5B:
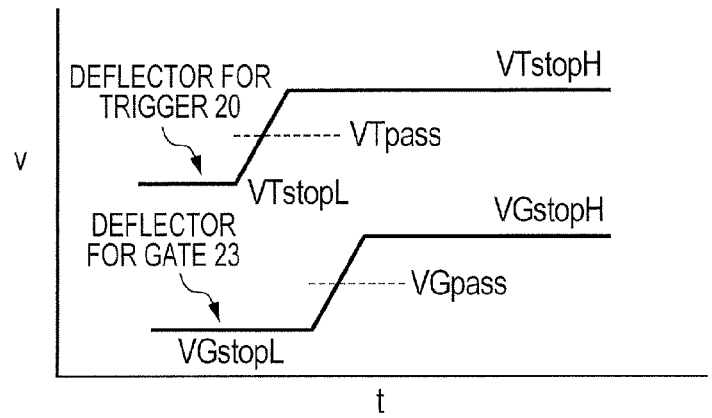
FIG. 5B illustrates a voltage applied to a binary switching type deflector.
Figure 5C:
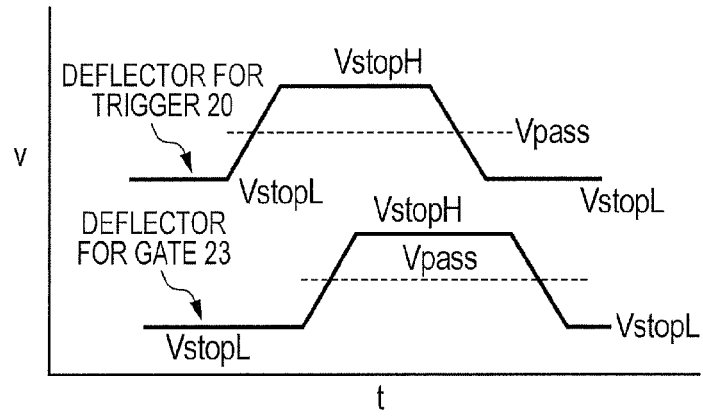
FIG. 5C illustrates a voltage applied to a binary repetition type deflector.

Here, as is illustrated in FIG. 5A, the VTpass is applied to the deflector for the trigger 20 in a pulsing way (trigger pulse), which passes ions only in fixed periods of time in a flying direction to chop the ion beam in a pulsing way. Incidentally, as is illustrated in FIG. 5B, the VTpass may be applied to the deflector for the trigger 20 when a voltage to be applied to the deflector 20 is changed from VTstopL to VTstopH. Alternatively, as is illustrated in FIG. 5C, voltages may be repeatedly changed within a range containing the VTpass. Incidentally, in graphs of FIG. 5A and the like, gradients of the lines which indicate voltage are schematically shown.

Figure 2A:
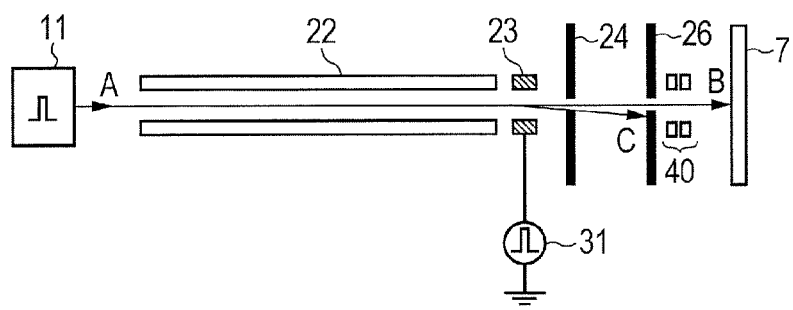
FIG. 2A illustrates an ion mass selector having a pulsed ion source.
Figure 2B:
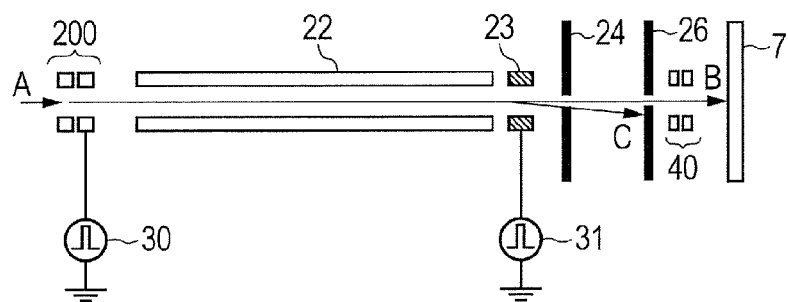
FIG. 2B illustrates an ion mass selector having a retarding type of chopper.

In addition, as is illustrated in FIG. 2B, in place of the deflector for the trigger 20 and the aperture electrodes for the trigger 21, a retarding type of chopper 200 may be used which applies a high voltage to the ions to make the ions reflect.

A circular flat plate which is provided with an aperture and rotates at high speed may be used to chop the cluster ion beam A, or in place of the application of the voltage to the electrode, a magnetic field may be applied to the cluster ion beam A to deflect the ion trajectory of the ion beam.

Furthermore, as is illustrated in FIG. 2A, a nozzle that injects a gas in a pulsing way or an ionization section that ionizes a cluster in a pulsing way may also be used. Thereby, the pulsed cluster ion beam A can be obtained.

Such a pulsed cluster ion beam A is incident on the flight tube 22 which is installed in the downstream side of the aperture electrode for the trigger 21. A voltage is applied to the flight tube 22 from a not-shown power source so that the inner part becomes an equipotential space. The cluster ion moves at a constant speed in the equipotential space in the flight tube 22. The mass dispersion occurs to cluster ions and the monomer ions in this process, according to the mass-to-charge ratio which each ion has.

Incidentally, the ion mass selector may have any structure as long as the equipotential space can be formed in the vacuum chamber 1, and may also have such a structure as to have a plurality of aperture electrodes arranged in the vacuum chamber in place of the flight tube 22.

The deflector for the gate 23 is installed in the downstream side of the flight tube 22. The cluster ions and the monomer ions are incident between a pair of parallel flat-plate electrodes which constitute the deflector for the gate 23, in ascending order of the mass. The deflector for the gate 23 forms an electric field between the parallel flat-plate electrodes similarly to the deflector for the trigger 21. The aperture electrode for the gate 26 is installed in the downstream side of the deflector for the gate 23.

Figure 2C:
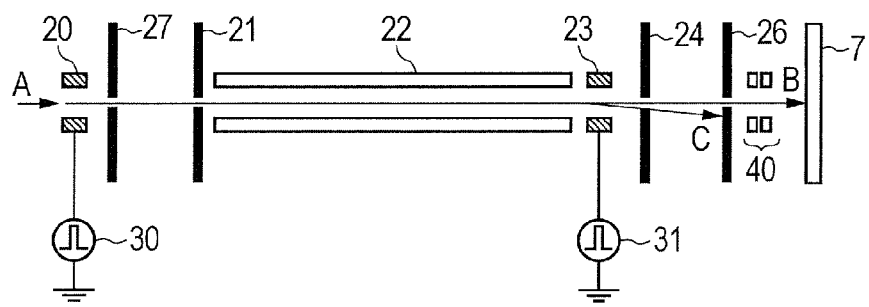
FIG. 2C illustrates an ion mass selector having an incident side aperture.
Figure 2D:
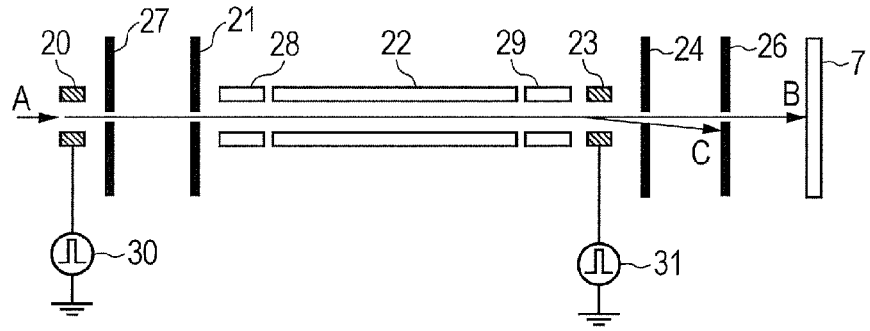
FIG. 2D illustrates an ion mass selector having an ion lens.

Incidentally, as is illustrated in FIG. 2D, ion lenses 28 or 29 is installed in the upstream side or the downstream side of the flight tube 22, respectively, or ion lenses 28 and 29 are installed in both sides, respectively, and can control the trajectory of the cluster ion beam A in the flight tube 22. As a result, the transmittance can be enhanced.

The pulsed power supply 31 for the gate applies VGpass in a pulsing way (gate pulse) to the deflector for the gate 23 at such timing that a cluster ion having a desired mass passes through the aperture electrode for the gate 26, and thereby the ion having the desired mass can be taken out. On the other hand, when the ion having the desired mass does not pass through the aperture electrode for the gate 26, the VGstop may be applied to the deflector for the gate 23 (FIG. 5A). This operation is done for interrupting an ion C having a mass different from the desired mass, by the aperture electrode for the gate 26. In addition, at least a part of the cluster ions having the desired mass pass through the opening of the outgoing aperture electrode 24.

Incidentally, the VGpass may also be applied to the deflector for the gate 23 in a similar way to that for the deflector for the trigger 20, as is illustrated in FIG. 5B or FIG. 5C.

Only cluster ions having a desired mass can be selected, and also a pulsed ion beam which is formed of two or more cluster ion groups having different masses can be formed by adjusting the duration time of the VGpass to be applied to the deflector for the gate 23.

The cluster ion beam B which has been mass-selected and has been pulsed is accelerated or decelerated and focused in the focusing section 5 (for instance, electrostatic lens 40), and then irradiates the object 7 to be irradiated held by the irradiation stage 6.

When the object 7 to be irradiated is irradiated with the cluster ions, the object 7 may be irradiated with the cluster ions in a scanned way in which the cluster ions are focused and scanned on the sample, or a particular region of the object 7 to be irradiated may be collectively irradiated with the cluster ions also in a projected way.

Charged particles or neutral particles such as secondary ions which have been produced from the object 7 to be irradiated are analyzed by the analysis apparatus 8. When a time-of-flight mass analyzer is used as the analysis apparatus 8, time-of-flight secondary ion mass analysis by the cluster ions is enabled. When a neutral particle detector provided with an ionization apparatus is used as the analysis apparatus 8, neutral particle mass analysis by the cluster ions is enabled.

In addition, if the surface of the object to be irradiated is subjected to two-dimensional mass analysis, and distribution information of each substance on the surface of an object to be measured is obtained, the present invention can be as applied to a mass microscope.

Incidentally, in the present embodiment, the cluster ion is described as an example, but the present invention can be applied also to substances which are charged so as to be capable of flying in the flight tube such as a molecular ion, a fullerene ion and a charged droplet (which are referred to as charged substances, in the present invention), in addition to the cluster ion.

In addition, the ion source is not limited to the above described combination of the nozzle 2 and the ionization section 3, but may ionize a particle which is formed of a cluster that has been generated by the cooling of a vapor of a solid, through an electron impact process or a photo-ionization process, or may also directly ionize a charged droplet or the surface of a solid or liquid by field evaporation. The ion source may be in any one state of gas, liquid and solid or in a mixed state thereof, and metal such as gold and bismuth may be formed to be the cluster ion.

In addition, a deflector which deflecting the ion by the application of a magnetic field may also be used in place of the parallel flat-plate type deflector.

The ions in the present invention include various types of cluster ions. The cluster means a material body in which two or more atoms or molecules are combined with each other by an intermolecular interaction, and the cluster ion means a material body in which the cluster is electrically charged. In addition, the cluster ion may be formed of a single type of atoms or molecules, or may also be formed of two or more types of atoms or molecules.

(Ion-Optical Simulation 1)

Figure 1C:
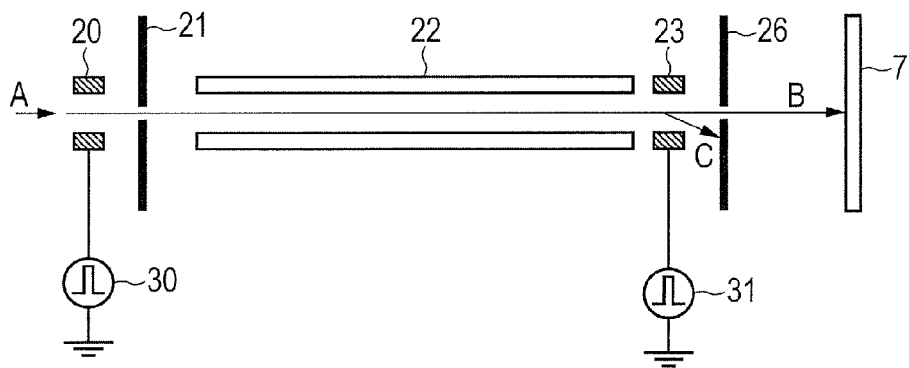
FIG. 1C illustrates a conventional ion mass selector.

Here, in order to compare the present invention with a conventional technology, firstly, a result of an ion-optical simulation for a conventional mass selector will be described in which an outgoing aperture electrode 24 is not provided as is illustrated in FIG. 1C.

Figure 3A:
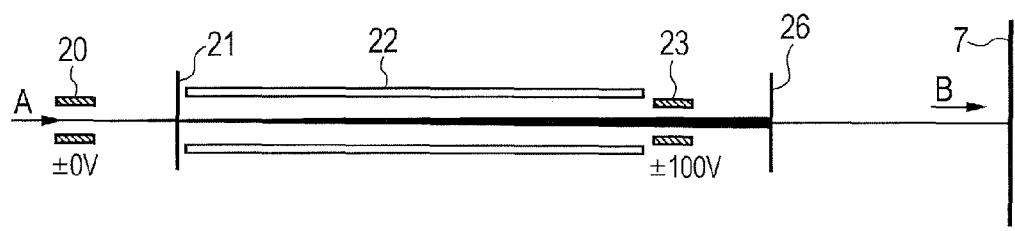
FIG. 3A illustrates a calculation result of ion trajectories in the conventional ion mass selector.

FIG. 3A illustrates a trajectory of a cluster ion having a positive electric charge. A kinetic energy of the cluster ion beam A is 10 [keV], and a divergence angle of the cluster ion beam A which has been incident on the deflector for the trigger 20 is 1 degree.

Both lengths of the deflector for the trigger 20 and the deflector for the gate 23 are 20 [mm], and a distance between the parallel flat-plate electrodes is 12 [mm]. Both of a distance from the end of the deflector for the trigger 20 to the aperture electrode for the trigger 21 and a distance from the end of the deflector for the gate 23 to the aperture electrode for the gate 26 are 40 [mm].

Both of the aperture electrode for the trigger 21 and the aperture electrode for the gate 26 are plate-shaped electrodes with a thickness of 1 [mm], and have circular openings with a diameter of 1 [mm].

The flight tube 22 is a cylindrical type of electrode having a length of 230 [mm] and a diameter of 20 [mm]. A distance between the aperture electrode for the trigger 21 and the flight tube 22 is 4 [mm], and a distance between the flight tube 22 and the deflector for the gate 23 is 5 [mm].

A central axis of the flight tube 22 is coaxially arranged with the circular openings of the aperture electrode for the trigger 21 and the aperture electrode for the gate 26. A distance from the aperture electrode for the gate 26 to the object 7 to be irradiated is 120 [mm].

Incidentally, in FIG. 3, the electrostatic lens 40 in the downstream side of the outgoing aperture electrode 24 is omitted, for the simplicity of description.

In the present embodiment, the flight tube 22, the aperture electrode for the trigger 21 and the aperture electrode for the gate 26 are grounded, but appropriate voltages may be applied to the parts.

When a voltage of 0 [V] is applied to the deflector for the trigger 20 as the VTpass, the cluster ion beam A is not deflected and is incident on an extending line of the central axis of the object 7 to be irradiated. In the present specification, such a state that the cluster ion beam A is not deflected is defined as a state in which a shift in a transverse direction is 0 [mm].

In FIG. 3A, as one example, +/−100 [V] was applied to the deflector for the gate 23, in other words, 100 [V] was applied to one electrode of the parallel flat-plate electrodes, and −100

[V] was applied to the other electrode thereof. Hereafter, unless otherwise specified, voltages which have different polarities but equal absolute values similarly in both sides of 0 [V] of the center are applied to the parallel flat-plate electrodes that constitute the deflector.

This voltage is transiently applied to the deflector for the gate 23. The voltage applied to the deflector 23 is switched from 0 [V] which is the VTpass to 310 [V] which is the VTstop.

Though a part of the cluster ion beam A which has been deflected by the deflector for the gate 23 collides against the aperture electrode for the gate 26, the others pass through the opening and are incident on the object 7 to be irradiated. At this time, there is the case in which the trajectory of the cluster ion beam A deviates from the extending line of the central axis due to the deflection of the part of the cluster ion beam A. Because of this, a cluster ion beam C which constitutes the cluster ion beam A is interrupted by the aperture electrode for the gate 26, and the remaining cluster ion beam B is incident on a portion which is deviated from the central axis of the object 7 to be irradiated. In the present specification, this state is defined as a state in which the shift in the transverse direction has occurred.

Here, when a plurality of cluster ions has flied toward the object to be irradiated from the flight tube and each cluster ion has reached the object to be irradiated, the average of the positions which each cluster ion has reached is defined as an average beam position. In addition, a ratio of the electric current or the number of ions of the cluster ion beam B which has reached the object 7 to be irradiated to that of the cluster ion beam A which has been incident on the deflector for the trigger 20 is defined as a transmittance. A graph in which a relationship between the transmittance and the average beam position is plotted is FIG. 4A (represented by the black rectangle symbol). In such a range that the average beam position leads up to 6 [mm], the transmittance is 14% which is the maximal value, and the cluster ion beam irradiates the object with a high transmittance. In other words, the points at which the ion beam B has arrived are scattered in such a large range as 6 times of the size of the opening of the aperture electrode for the gate 26, due to the influence of the deflection by the deflector for the gate 23.

In addition, the applied voltage to the deflector has been set at 100 [V], and thereby the irradiation range of the cluster ion beam results in being substantially spread to approximately 8 [mm]. The irradiation range of the primary ion beam exerts an effect on the spatial resolution of the TOF-SIMS, and accordingly the foot of the primary ion beam becomes a factor of aggravating the spatial resolution when the object is irradiated with the cluster ions which are the primary ions of the TOF-SIMS.

(Ion-Optical Simulation 2)

Figure 3B:
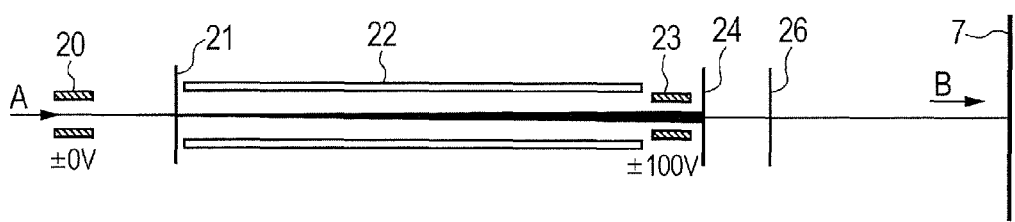
FIG. 3B illustrates a calculation result of ion trajectories in the ion mass selector according to the first embodiment.

Next, a result of an ion-optical simulation for a mass selector in the present embodiment is illustrated in FIG. 3B. An outgoing aperture electrode 24 which is a plate-shaped electrode with a thickness of 1 [mm] and has a circular opening with a diameter of 1 [mm] is provided at a position in a 34 [mm] upstream side of the aperture electrode for the gate 26, and other electrodes than the above electrode and simulation conditions are similar to those in the case of FIG. 3A. In addition, +/−100 [V] was applied to the deflector for the gate 23.

In FIG. 3B, the cluster ions pass through the outgoing aperture electrode 24, but a part of the cluster ions collide against the aperture electrode for the gate 26, and the cluster ion beam B which is incident on the object 7 to be irradiated decreases. In other words, the transmittance decreases.

In the present embodiment, the openings of the outgoing aperture electrode 24 and the aperture electrode for the gate 26 have the same size, but the sizes of both of the openings may be different from each other. For instance, as is illustrated in FIG. 4E, the sizes of the openings may be set so that an acceptance angle H of the opening of the outgoing aperture electrode 24 with reference to an intersection Z of the surface of the object 7 to be irradiated with a line Y which connects the centers of the openings of the aperture electrode for the gate 26 and the outgoing aperture electrode 24 is smaller than an acceptance angle G of the opening of the aperture electrode for the gate 26.

Furthermore, the sizes of the openings may be set so that an asymptote (solid line E in FIG. 4D) which passes through a border of the opening of the aperture electrode for the gate 26 out of asymptotes of the trajectories of the ions that have been deflected by the deflector for the gate 23 intersects with an electrode portion surrounding the opening of the outgoing side aperture electrode 24 (in other words, so that aperture electrode 24 interrupts ions).

Figure 4A:
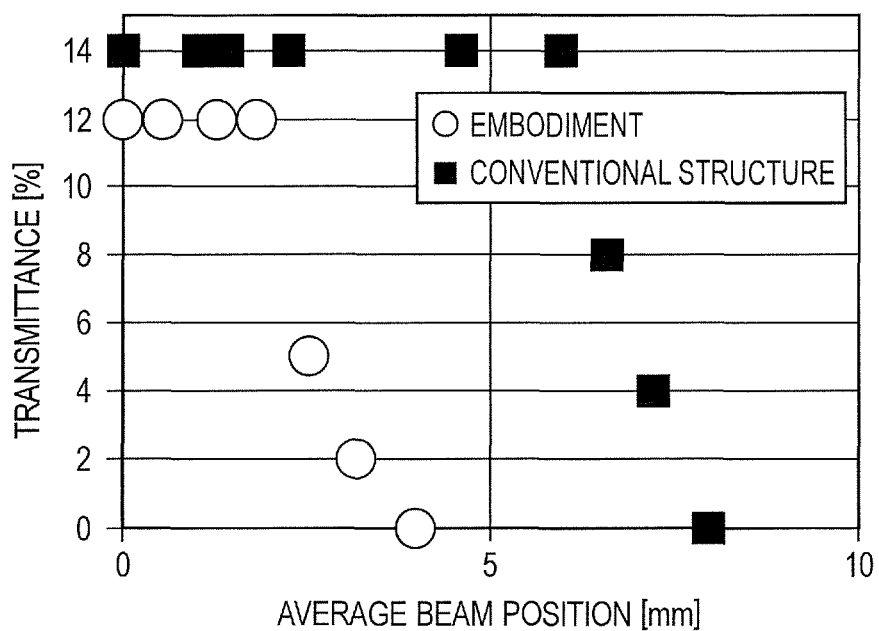
FIG. 4A illustrates a relationship between an average beam position and transmittance according to the first embodiment.
Figure 4B:
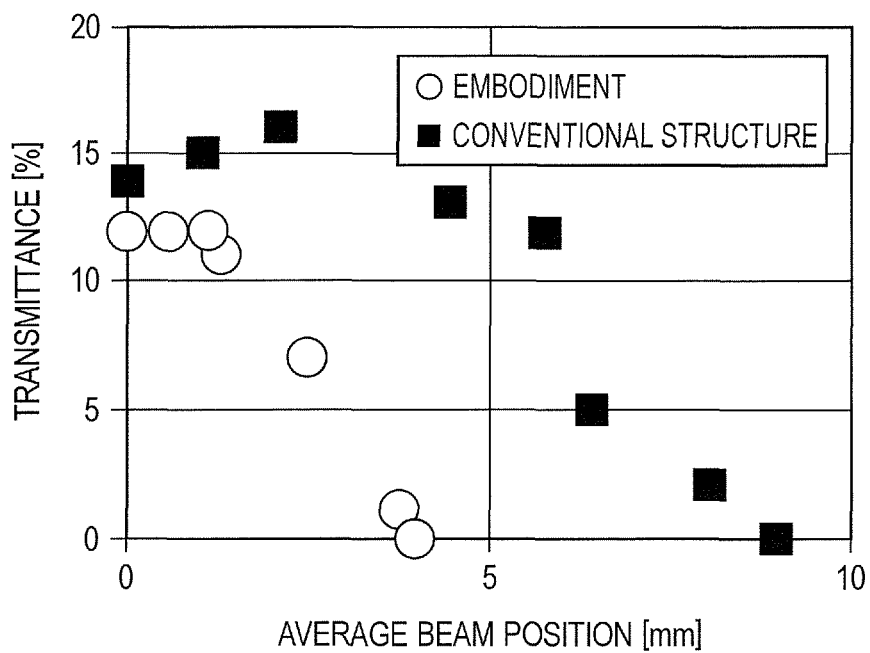
FIG. 4B illustrates a relationship between an average beam position and transmittance according to the second embodiment.

FIG. 4A illustrates a relationship between the transmittance and the average beam position of the cluster ion beam in the present embodiment (where symbol is open circle), which has been plotted when a voltage to be applied to the aperture electrode for the gate 26 has been changed.

(Comparison of Result)

A range in which the transmittance of the cluster ion beam that was incident on the object 7 to be irradiated was 12% or more decreased to 2 [mm] or less in the present embodiment from 6 [mm] of the conventional mass selector. Accordingly, the spread (accuracy) of the incident position of the cluster ion beam B was improved to ⅓ or less.

Figure 4C:
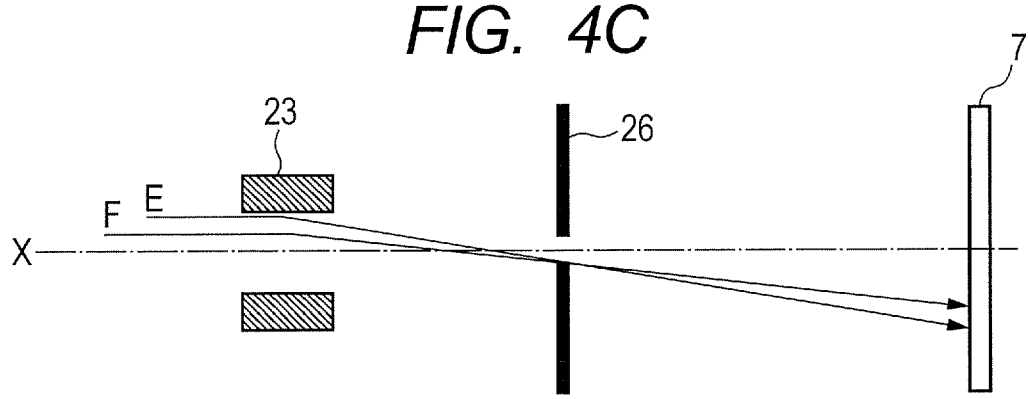
FIG. 4C is a schematic view of a relationship between an aperture electrode for a gate and an ion trajectory, in the conventional ion mass selector.

In the ion-optical simulation in FIG. 3A, as is schematically illustrated in FIG. 4C, a cluster ion beam E which is distant from the central axis X of the flight tube when being incident on the deflector for the gate 23 is incident on the object 7 to be irradiated in a state of being largely deflected, and accordingly the shift in the transverse direction increases.

Figure 4D:
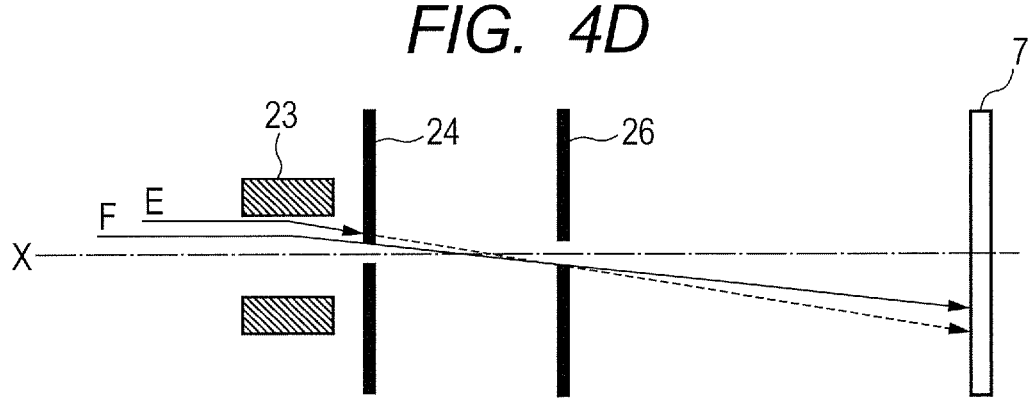
FIG. 4D is a schematic view of a relationship between an aperture electrode for a gate and an outgoing side aperture electrode, and an ion trajectory, in the ion mass selector according to the present invention.
Figure 4E:
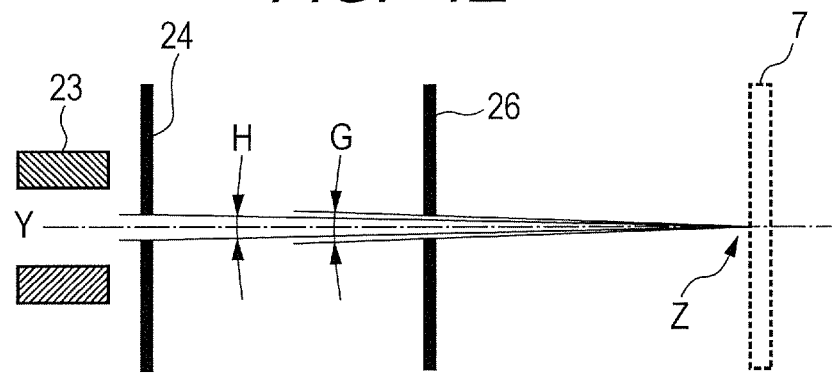
FIG. 4E illustrates acceptance angles which are formed by the aperture electrode for the gate and the outgoing side aperture electrode, respectively.

On the other hand, in the ion-optical simulation in FIG. 3B, as is schematically illustrated in FIG. 4D, the cluster ion beam E which is distant from the central axis X of the flight tube is interrupted by the aperture electrode for the gate 26. As a result, only a cluster ion beam F close to the central axis X of the flight tube passes through the aperture electrode for the gate 26, and accordingly the shift in the transverse direction decreases as a whole cluster ion beam.

As is illustrated in FIG. 4A, the shift in the transverse direction is suppressed in the present embodiment, though a distance between the deflector for the gate 23 and the aperture electrode for the gate 26 is equal to that of the conventional mass selector.

Accordingly, when a cluster ion treatment apparatus having the mass selector according to the present embodiment conducts processing such as etching by the cluster ions, the cluster ion treatment apparatus can enhance the processing accuracy. In addition, the TOF-SIMS having the mass selector according to the present embodiment can enhance its spatial resolution.

On the other hand, when a shift in a fixed transverse direction is accepted, even the distance between the deflector for the gate 23 and the aperture electrode for the gate 26 can be shortened.

As a result, the distance between the deflector for the gate 23 and the aperture electrode for the gate 26 can be shortened compared to the length of the flight tube, and accordingly the measurement accuracy of the time of flight of the cluster ions is enhanced.

Second Embodiment

An ion mass selector (FIG. 2C) according to the present embodiment is similar to that in the first embodiment, except for such a positional relationship among these three devices that an incident side aperture electrode 27 is provided in between the deflector for the trigger 20 and the aperture electrode for the trigger 21.

A distance between the deflector for the trigger 20 and the incident side aperture electrode 27 is 5 [mm], and a distance between the incident side aperture electrode 27 and the aperture electrode for the trigger 21 is 34 [mm]. In the present embodiment, the incident side aperture electrode 27 is grounded, but a voltage may be applied thereto.

Figure 3C:
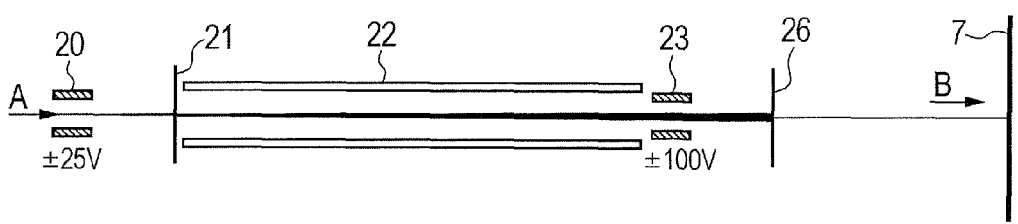
FIG. 3C illustrates a calculation result of ion trajectories drawn when a voltage has been applied to a deflector for a trigger in the conventional ion mass selector.
Figure 3D:
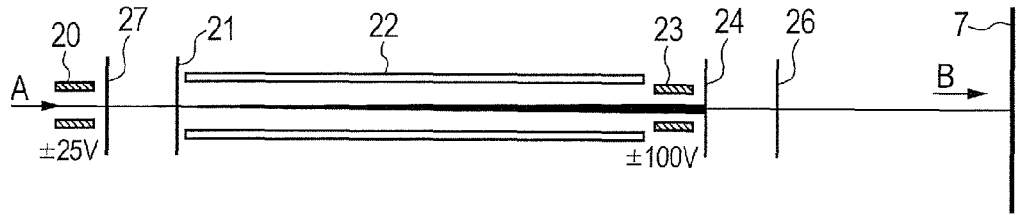
FIG. 3D illustrates a calculation result of ion trajectories drawn when a voltage has been applied to a deflector for a trigger in an ion mass selector according to a second embodiment.

A result of an ion-optical simulation for a mass selector in the present embodiment is illustrated in FIG. 3D. Voltages to be applied to each electrode are similar to those in the first embodiment, except that a voltage of +/−25 [V] is applied to the deflector for the trigger 20. In addition, acceleration energy for the cluster ion beam A and the like are also similar to those in the first embodiment.

A voltage is applied to the deflector for the trigger 20 to pulse the cluster ion beam A, as is illustrated in FIG. 5A. At this time, at least a part of the cluster ions pass through the aperture electrode for the trigger 21 and the incident side aperture electrode 27, in a deflected state. The voltage of +/−25 [V] which has been applied to the deflector for the trigger 20 is any voltage in between the VTpass and the VTstop.

When there is no incident side aperture electrode 27, as is illustrated in FIG. 3C, such a cluster ion is incident on the flight tube 22 diagonally to the central axis X of the flight tube, which consequently exerts an effect on the trajectory of the cluster ion flying from the flight tube 22 to its downstream side.

Thus, a relationship between an average beam position and a transmittance in the present embodiment in which an outgoing aperture electrode 24 and an incident side aperture electrode 27 are provided is illustrated in FIG. 4B (represented by the open circle symbol), in a similar way to that in the first embodiment. For purposes of comparison, the result obtained by conducting an ion-optical simulation for a conventional mass selector in which an outgoing aperture electrode 24 is not provided is also illustrated in FIG. 4B (represented by the black rectangle symbol). For information, a voltage of +/−25 [V] is similarly applied to the deflector for the trigger 20.

As is illustrated in FIG. 4B, a range in which the transmittance of the cluster ion beam that was incident on the object 7 to be irradiated was 12% or more decreased to approximately 1.5 [mm] in the mass selector in the present embodiment, from 6 [mm] in the conventional mass selector. Accordingly, the accuracy of the incident position of the cluster ion beam was enhanced to ¼.

Even in the state in which the voltage is applied to the deflector for the trigger 20, the inclination of the cluster ions with respect to the central axis X in the flight tube 22 can be suppressed, and accordingly the shift in the transverse direction in the downstream side of the aperture electrode for the gate 26 is also reduced.

Third Embodiment

An ion mass selector (FIG. 2A) according to the present embodiment is similar to that in the first embodiment, except that the ion mass selector has a pulsed ion source 11 which can generate ions in a pulsing way, in place of the deflector for the trigger 20 and the aperture electrode for the trigger 21.

The pulsed ion source 11 can generate a cluster ion beam D which has been pulsed so as to have a pulse width equivalent to that of a chopper for a trigger. The pulsed ion source 11 may be a device, for instance, which generates cluster ions by irradiating a gas, a solid or a liquid with laser light or electrons by using a pulsed laser or an electron gun which can be driven in a pulsing way. Furthermore, the pulsed ion source 11 may also be a device which generates a charged droplet, such as an electroinject that applies high voltage to a droplet in a pulsing way.

Furthermore, the pulsed ion source 11 may also be a device which generates a pulsed cluster ion beam D by using a nozzle for injecting a gas in a pulsing way or also an ionization section that ionizes clusters in a pulsing way.

In the present embodiment, the ion mass selector does not have the deflector for the trigger 20, and accordingly has a feature that the inclination of the cluster ion beam D with respect to the central axis X of the flight tube decreases.

Fourth Embodiment

An ion mass selector (FIG. 2B) according to the present embodiment is similar to that in the first embodiment, except that the ion mass selector has a retarding type of chopper 200 for the trigger, in place of the deflector for the trigger 20 and the aperture electrode for the trigger 21.

The chopper 200 for the trigger includes two coaxial cylindrical types of electrodes, as an example. Voltage is applied to a cylindrical electrode in the downstream side in a pulsing way, but the cylindrical electrode in the upstream side is grounded. For information, an appropriate voltage may be applied to the latter cylindrical electrode. A voltage is applied to the cylindrical electrode in the downstream side, and thereby the cluster ion beam A is interrupted and is chopped, under the condition that the voltage generates an electric field of such a degree that the cluster ion beam A cannot pass through the cylindrical electrode.

Coaxial aperture electrodes may be used in place of the coaxial cylindrical type of the electrodes. In addition, a mesh electrode may also be used.

In the present embodiment, a retarding type of chopper 200 for the trigger has a feature that the inclination of the cluster ion beam A with respect to the central axis X of the flight tube decreases even though the pulsed ion source is not used.

Fifth Embodiment

The ion mass selector (FIG. 6A) according to the present embodiment is similar to that in the first embodiment, except that the ion mass selector has a different positional relationship between an extending line of a direction in which a cluster ion A flies before being incident on a deflector for a gate 23, and the openings of an outgoing side aperture electrode 24 and an aperture electrode for a gate 26.

Figure 6A:
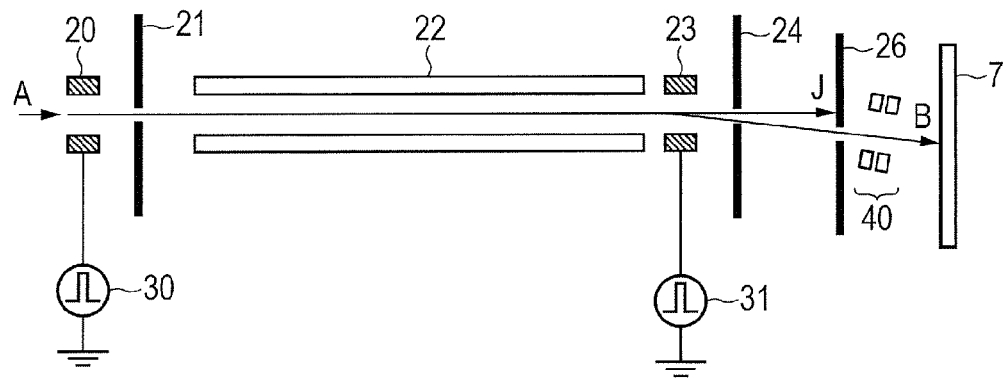
FIG. 6A illustrates an ion mass selector according to a fifth embodiment.

The cluster ion beam A which has been pulsed by the deflector for the trigger 20 and the aperture electrode for the trigger 21 passes through a flight tube 22, and is incident between a pair of parallel flat-plate electrodes which constitute the deflector for the gate 23. After that, the cluster ion beam A is deflected by the deflector for the gate 23, but in the present embodiment, the cluster ion B which has been deflected to an appropriate angle by the deflector for the gate 23 passes through the aperture electrode for the gate 26. This is because the center of the opening of the aperture electrode for the gate 26 deviates from the extending line of the direction in which the cluster ion A flies before being incident on the deflector for the gate 23, as is illustrated in FIG. 6A.

On the other hand, the ion C having a mass different from the desired mass cannot pass through the opening of the aperture electrode for the gate 26, and accordingly is interrupted by the aperture electrode for the gate 26. This is because an angle to which the ion C is deflected by the deflector for the gate 23 is different from an angle to which the cluster ion beam B having the desired mass is deflected, or because the ion C is not deflected.

On the other hand, neutral particles which are emitted from the ion source or the like fly approximately along the extending line of the direction in which the cluster ion beam A flies before being incident on the deflector for the gate 23. Because of this, the neutral particles J which are not deflected by the deflector for the gate 23 continue flying along the extending line also after having passed through the deflector for the gate 23.

Here, when the aperture electrode for the gate 26 is provided so that the extending line intersects with a surrounding part of the opening of the aperture electrode for the gate 26, the neutral particle C cannot pass through the opening of the aperture electrode for the gate 26 and accordingly is interrupted.

According to such a structure, the mass selector has an effect of reducing the abundance of the neutral particles in the downstream side of the aperture electrode for the gate 26, and accordingly has an effect of suppressing the decay of the cluster ion beam B, which is caused by collision with the neutral particles, and/or the contamination of the object 7 to be irradiated due to irradiation with the neutral particles.

Figure 6B:
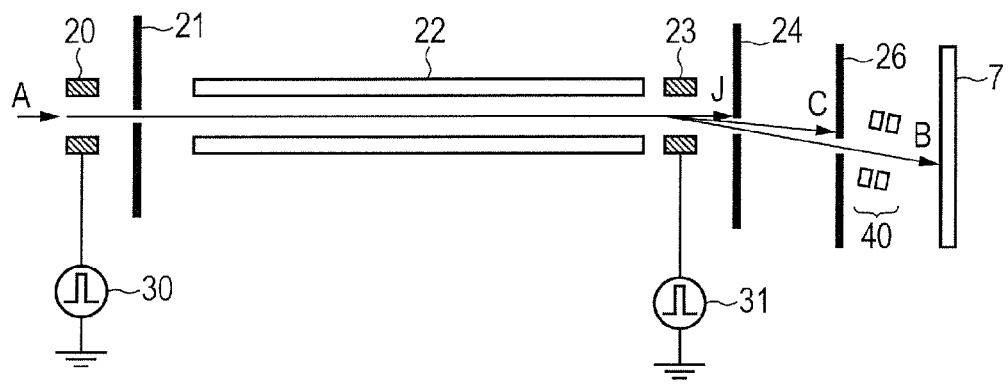
FIG. 6B illustrates a modified example of the ion mass selector where the position at which an outgoing side aperture electrode is installed is changed.

Incidentally, as is illustrated in FIG. 6B, the outgoing side aperture electrode 24 may be provided so that the extending line intersects with the surrounding part of the opening of the outgoing side aperture electrode 24. In such a case, the neutral particle J which has passed through the flight tube 22 is interrupted by the outgoing side aperture electrode 24, and accordingly, the mass selector has an effect of further reducing the abundance of the neutral particles in the downstream side of the outgoing side aperture electrode 24.

If a position at which the central axis of the cluster ion beam A drawn before being incident on the deflector for the gate 23 intersects with the surrounding part of the opening of the outgoing side aperture electrode 24 is apart from the opening by an appropriate distance, the outgoing side aperture electrode 24 can more effectively interrupt the neutral particles. As one example, the case is taken up in which the above distance is larger than the beam diameter of the cluster ion beam A.

Figure 6C:
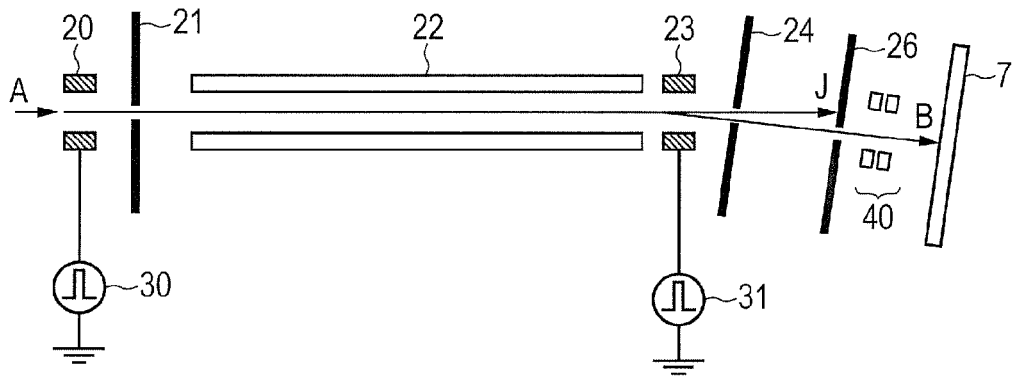
FIG. 6C illustrates a modified example of the ion mass selector where directions in which a first aperture electrode and the outgoing side aperture are installed, respectively, are changed.

The central axes of the outgoing side aperture electrode 24 and the aperture electrode for the gate 26 may be parallel to the central axis of the flight tube 22, as is illustrated in FIG. 6A and FIG. 6B. In addition, as is illustrated in FIG. 6C, the central axes may be parallel to the optical axis of the ion lens 40 that is parallel to the direction in which the cluster ion beam b flies. In such a case, the mass selector has an effect of decreasing the disturbance of the electric field between the ion lens 40 and the aperture electrode for the gate 26, and reducing the aberration of the ion lens 40.

Sixth Embodiment

The ion mass selector (FIG. 7A) according to the present embodiment is similar to that in the first embodiment, except that an extending line of a direction in which a cluster ion A flies before being incident on the deflector for the trigger 20 is not the same as a direction in which a cluster ion beam L that has been pulsed by the aperture electrode for the trigger 21 flies, in other words, that the cluster ion L which has been deflected to an appropriate angle by the deflector for the trigger 20 passes through the aperture electrode for the trigger 21.

When at least a part of the cluster ion beam A is pulsed, the cluster ion beam L is deflected by the deflector for the trigger 20 and passes through the aperture electrode for the trigger 21. In addition, when the cluster ion beam A is not sufficiently deflected by the deflector for the trigger 20, the cluster ion beam A is interrupted by the surrounding part of the opening of the aperture electrode for the trigger 21.

On the other hand, neutral particles emitted from the ion source or the like fly approximately along the extending line of the direction in which the cluster ion beam A flies before being incident on the deflector for the trigger 20, but are not deflected by the deflector for the trigger 20, and accordingly continues flying along the extending line in the state. Here, if the aperture electrode for the trigger 21 is provided so that the direction in which the cluster ion A flies before being incident on the deflector for the trigger 20 intersects with the surrounding part of the opening of the aperture electrode for the trigger 21, at least a part of the neutral particles J are interrupted by the aperture electrode for the trigger 21.

If a position at which the central axis of the cluster ion beam A drawn before being incident on the deflector for the trigger 20 intersects with the surrounding part of the opening of the aperture electrode for the trigger 21 is distant from the opening by an appropriate distance, the neutral particles J can be more effectively interrupted. As one example, the case is taken up in which the distance is larger than the beam diameter of the cluster ion beam A.

In such a case, the mass selector has an effect of reducing the abundance of the neutral particles in the downstream side of the aperture electrode for the trigger 21, and accordingly suppressing the decay of the cluster ion beam B, which is caused by the neutral particles.

Figure 7A:
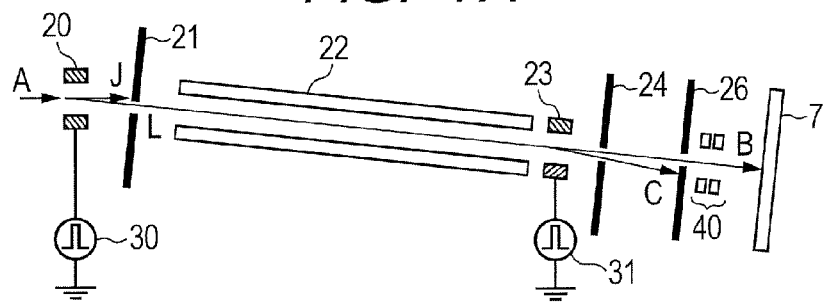
FIG. 7A illustrates an ion mass selector according to a sixth embodiment.
Figure 7B:
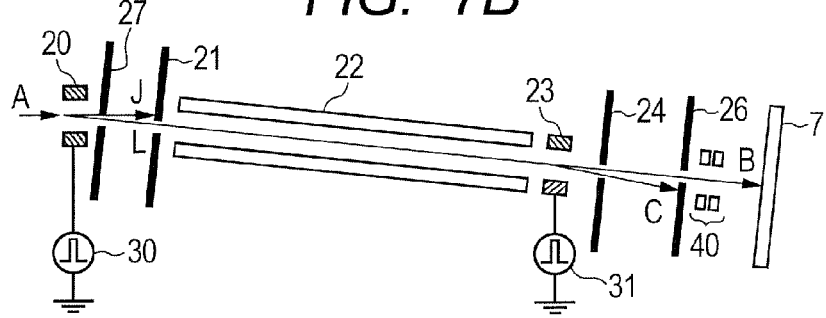
FIG. 7B illustrates a modified example of the ion mass selector having an incident side aperture.

In addition, as is illustrated in FIG. 7B, an incident side aperture electrode 27 may be installed in between the deflector for the trigger 20 and the aperture electrode for the trigger 21. It can be expected that the incident side aperture electrode 27 shows an effect of being capable of suppressing the inclination of the cluster ions with respect to the central axis X in the flight tube 22, which is similar to that in the second embodiment.

Figure 7C:
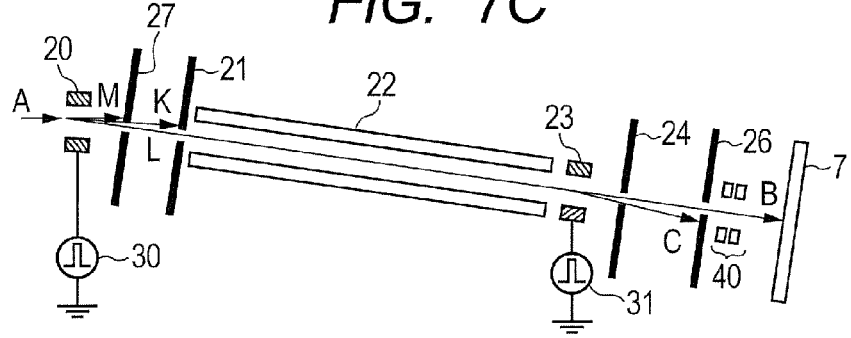
FIG. 7C illustrates a modified example of the ion mass selector where the position at which the incident side aperture is installed is changed.

Furthermore, as is illustrated in FIG. 7C, if the incident side aperture electrode 27 is provided so that the direction in which the cluster ion A flies before being incident on the deflector for the trigger 20 intersects with the surrounding part of the opening of the incident side aperture electrode 27, at least a part of the neutral particles M which are emitted from the ion source or the like are interrupted by the incident side aperture electrode 27. In such a case, the mass selector has an effect of further reducing the abundance of the neutral particles in the downstream side of the incident side aperture electrode 27, and suppressing the decay of the cluster ion L.

Figure 7D:
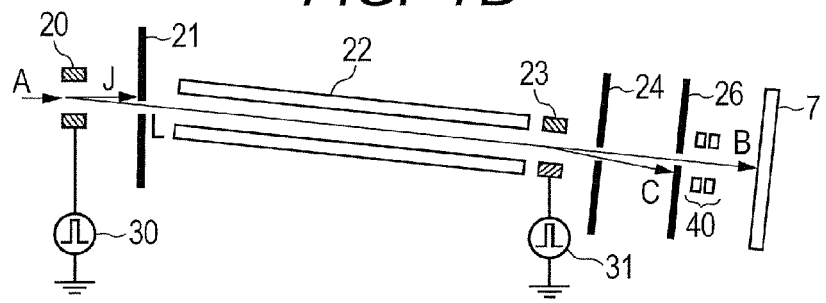
FIG. 7D illustrates a modified example of the ion mass selector where a direction in which the incident side aperture is installed is changed.

In addition, as is illustrated in FIG. 7D, the central axis of the aperture electrode for the trigger 21 may be parallel to the direction in which the cluster ion A flies before being incident on the deflector for the trigger 20. In such a case, there is an advantage that the mass selector is easily manufactured. On the other hand, the central axes of the incident side aperture electrode 27 and/or the aperture electrode for the trigger 21 may be parallel to the central axis of the flight tube 22, as are illustrated in FIG. 7A, FIG. 7B and FIG. 7C. In this case, the mass selector has an effect of decreasing the disturbance of the electric field between the aperture electrode for the trigger 21 and the flight tube 22, and decreasing the disturbance of the trajectory of the ions in the flight tube 22.

A time-of-flight mass selector according to the present invention can be used as a cluster ion irradiation apparatus by being combined with an ion source and a stage for holding an object to be irradiated with ions. In addition, the time-of-flight mass selector according to the present invention can be used as a surface analysis apparatus by being combined with a detector for detecting neutral particles or charged particles which have been emitted from an object to be irradiated. In addition, when a secondary ion mass analyzer is used as the detector in the surface analysis apparatus, the time-of-flight mass selector according to the present invention can also be used as a part of the detector.

The present invention can provide a time-of-flight mass selector which can irradiate an object with ions with high positional accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-043801, filed Mar. 6, 2013, which is hereby incorporated by reference herein in its entirety.

What is claimed is:

1. A mass selector comprising at least:
a vacuum chamber having an equipotential space that makes a charged substance fly therein;
a deflector that is installed in a downstream side with respect to the vacuum chamber in a direction in which the charged substance flies, where the deflector is configured to deflect the direction in which the charged substance flies toward a direction that is perpendicular to a direction in which the charged substance is incident on the deflector;
a first aperture electrode that is installed in a downstream side with respect to the deflector in the direction in which the charged substance flies; and
a second aperture electrode that is installed in between the deflector and the first aperture electrode.

2. The mass selector according to claim 1, further comprising a flight tube which is arranged so as to surround the equipotential space.

3. The mass selector according to claim 1, wherein an opening of the first aperture electrode and an opening of the second aperture electrode have the same size.

4. The mass selector according to claim 1, wherein the deflector deflects the charged substance by forming an electric field.

5. The mass selector according to claim 1, wherein the deflector deflects the charged substance by a magnetic field.

6. The mass selector according to claim 1, further comprising a chopper for a trigger for chopping the charged substance, which is installed in an upstream side with respect to the flight tube in the direction in which the charged substance flies.

7. The mass selector according to claim 6, wherein the chopper for the trigger is installed in the upstream side with respect to the flight tube in the direction in which the charged substance flies, and is an electrode that forms an electric field for reflecting the charged substance.

8. The mass selector according to claim 6, wherein the chopper for the trigger comprises:
a deflector for a trigger, which is installed in an upstream side with respect to the flight tube in the direction in which the charged substance flies; and
an aperture electrode for a trigger, which is installed in between the flight tube and the deflector for the trigger.

9. The mass selector according to claim 8, further comprising an incident side aperture electrode which is installed in between the deflector for the trigger and the aperture electrode for the trigger.

10. The mass selector according to claim 8, wherein the deflector for the trigger deflects the charged substance by forming an electric field.

11. The mass selector according to claim 10, wherein an extending line of the direction in which the charged substance flies when being incident on the deflector for the trigger intersects with a surrounding part of an opening of the aperture electrode for the trigger.

12. The mass selector according to claim 10, wherein an extending line of the direction in which the charged substance flies when being incident on the deflector for the trigger intersects with a surrounding part of an opening of an incident side aperture electrode.

13. The mass selector according to claim 8, wherein the deflector for the trigger deflects the charged substance by a magnetic field.

14. An ion gun comprising:
the mass selector according to claim 1; and
an ion source which is installed in a most upstream side with respect to the flight tube in a direction in which an ion that is the charged substance flies.

15. The ion gun according to claim 14, wherein the ion source is a pulsed ion source which generates ions in a pulsing way.

16. The ion gun according to claim 14, wherein the ion source comprises:
a nozzle which injects a gas or a liquid that becomes a raw material of a cluster under a reduced-pressure atmosphere; and
an ionization section which ionizes the cluster injected from the nozzle.

17. A mass spectrometer comprising:
the ion gun according to claim 14;
a stage which holds an object to be irradiated with the ion; and
a detector which detects a neutral particle or a charged particle emitted from the object to be irradiated.

18. A mass microscope comprising:
the ion gun according to claim 14;
a stage which holds an object to be irradiated with the ion; and
a detector which detects a neutral particle or a charged particle emitted from the object to be irradiated.

19. The mass microscope according to claim 18, wherein the detector is a secondary ion mass analyzer.

20. A mass selector comprising at least:
a vacuum chamber having an equipotential space that makes a charged substance fly therein;
a deflector that is installed in a downstream side with respect to the vacuum chamber in a direction in which the charged substance flies;
a first aperture electrode that is installed in a downstream side with respect to the deflector in the direction in which the charged substance flies; and
a second aperture electrode that is installed in between the deflector and the first aperture electrode, wherein when an intersection of a line which connects centers of openings of the first aperture electrode and the second aperture electrode with a surface on which an object to be irradiated with the charged substance is installed is determined to be a reference, an acceptance angle of the opening of the second aperture electrode is smaller than an acceptance angle of the opening of the first aperture electrode.

21. A cluster ion irradiation apparatus comprising:
(a) an ion gun comprising:
   a mass selector comprising at least:
      a vacuum chamber having an equipotential space that makes a charged substance fly therein;
      a deflector that is installed in a downstream side with respect to the vacuum chamber in a direction in which the charged substance flies;
      a first aperture electrode that is installed in a downstream side with respect to the deflector in the direction in which the charged substance flies; and
      a second aperture electrode that is installed in between the deflector and the first aperture electrode; and
   an ion source which is installed in a most upstream side with respect to the flight tube in a direction in which an ion that is the charged substance flies; and
(b) a stage which holds an object to be irradiated with the ion.

22. A mass selector comprising at least:
   a vacuum chamber having an equipotential space that makes a charged substance fly therein;
   a deflector that is installed in a downstream side with respect to the vacuum chamber in a direction in which the charged substance flies;
   a first aperture electrode that is installed in a downstream side with respect to the deflector in the direction in which the charged substance flies; and
   a second aperture electrode that is installed in between the deflector and the first aperture electrode,
   wherein an extending line of the direction in which the charged substance flies when being incident on the deflector intersects with a surrounding part of an opening of the first aperture electrode and/or a surrounding part of an opening of the second aperture electrode.

23. The mass selector according to claim 22, wherein the extending line of the direction in which the charged substance flies when being incident on the deflector intersects with the surrounding part of the opening of the first aperture electrode.

24. The mass selector according to claim 22, wherein the extending line of the direction in which the charged substance flies when being incident on the deflector intersects with the surrounding part of the opening of the second aperture electrode.

* * * * *